United States Patent
Han et al.

(10) Patent No.: US 11,836,325 B2
(45) Date of Patent: Dec. 5, 2023

(54) DISPLAY DEVICE

(71) Applicant: LG Display Co., Ltd., Seoul (KR)

(72) Inventors: JinHyeon Han, Paju-si (KR); SangHoon Jeong, Iksan-si (KR); Minji Kim, Gumi-si Gyeongsangbuk-do (KR); JaeYoung Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/965,106

(22) Filed: Oct. 13, 2022

(65) Prior Publication Data

US 2023/0214073 A1    Jul. 6, 2023

(30) Foreign Application Priority Data

Dec. 30, 2021 (KR) .................. 10-2021-0192446

(51) Int. Cl.
| | | |
|---|---|---|
| *G06F 3/044* | (2006.01) | |
| *H10K 50/844* | (2023.01) | |
| *H10K 59/40* | (2023.01) | |
| *G06F 3/041* | (2006.01) | |
| *H10K 59/131* | (2023.01) | |
| *H10K 59/00* | (2023.01) | |

(52) U.S. Cl.
CPC ........ *G06F 3/0446* (2019.05); *G06F 3/04164* (2019.05); *H10K 50/844* (2023.02); *H10K 59/40* (2023.02); *G06F 3/0412* (2013.01); *G06F 2203/04111* (2013.01); *G06F 2203/04112* (2013.01); *H10K 59/00* (2023.02); *H10K 59/131* (2023.02)

(58) Field of Classification Search
CPC ...... G06F 3/0446; G06F 3/044; G06F 3/0412; G06F 2203/04111; G06F 2203/04112; H10K 50/844; H10K 50/84; H10K 59/40; H10K 59/12; H10K 59/122
See application file for complete search history.

(56) References Cited

U.S. PATENT DOCUMENTS

| | | | | |
|---|---|---|---|---|
| 10,061,147 B2* | 8/2018 | Du | ................... | G02F 1/136204 |
| 10,782,842 B2* | 9/2020 | Na | ........................ | G06F 3/047 |
| 2013/0285979 A1* | 10/2013 | Liu | ..................... | G06F 3/0445 |
| | | | | 345/174 |

(Continued)

FOREIGN PATENT DOCUMENTS

| | | |
|---|---|---|
| KR | 10-2016-0020987 A | 2/2016 |
| KR | 10-2020-0067523 A | 6/2020 |

*Primary Examiner* — Darlene M Ritchie
(74) *Attorney, Agent, or Firm* — POLSINELLI PC

(57) ABSTRACT

A display device includes a substrate including an active area and an inactive area which encloses the active area, a common voltage line which is disposed in the inactive area and is connected to the light emitting diode, an encapsulation unit which covers the active area and a part of the inactive area, a touch sensing unit disposed on the encapsulation unit, and an auxiliary line which is disposed on the encapsulation unit and is connected to the common voltage line, the touch sensing unit includes a plurality of touch electrodes and a bridge pattern which connects the plurality of second touch electrodes, and the auxiliary line is formed of the same material as the bridge pattern and is disposed on the same layer as the bridge pattern, and the auxiliary line is disposed in both the active area and the inactive area.

15 Claims, 8 Drawing Sheets

(56) References Cited

U.S. PATENT DOCUMENTS

| | | | |
|---|---|---|---|
| 2019/0332215 A1* | 10/2019 | Kim | G02F 1/13338 |
| 2020/0152707 A1* | 5/2020 | Won | H10K 50/844 |
| 2020/0193907 A1* | 6/2020 | Shin | G09G 3/3258 |
| 2020/0363905 A1* | 11/2020 | Jo | G06F 3/0443 |
| 2023/0189583 A1* | 6/2023 | Lee | H10K 59/122 |
| | | | 257/40 |

* cited by examiner

DISPLAY DEVICE

CROSS-REFERENCE TO RELATED APPLICATION

This application claims the priority of Korean Patent Application No. 10-2021-0192446 filed on Dec. 30, 2021, which is hereby incorporated by reference in its entirety.

BACKGROUND

Field of the Disclosure

The present disclosure relates to a display device, and more particularly, to a display device in which an influence of an electric field caused by a potential difference between wiring lines is reduced in a touch-integrated display device.

Description of the Background

A touch screen is one type of input devices which are installed in a display device to allow a user to input information by touching a screen with a finger or a pen while watching a display screen.

Recently, multimedia display devices, such as a television, a mobile phone, a tablet computer, a navigation, and a game player, include a touch screen which is capable of recognizing a touch of the user.

In a touch screen-integrated display device which includes a touch screen, as a display device, a liquid crystal display device, an organic light emitting display device, or a quantum dot display device may be used. The organic light emitting display device has a high response speed and a low power consumption, and is a self-emitting device which does not require a separate light source, unlike the liquid crystal display device so that the organic light emitting display device is attracting attention as a next-generation display device.

SUMMARY

Accordingly, the present disclosure is to provide a display device which is capable of reducing a big potential difference between a high potential voltage and a low potential voltage which may be caused when a highly efficient element is applied.

The present disclosure is also to provide a display device which is capable of minimizing an influence of an electric field due to a potential difference between a high potential voltage and a low potential voltage.

Further, the present disclosure is to provide a display device which improves a low potential voltage (VSS) rising.

The present disclosure is not limited to the above-mentioned, which are not mentioned above, can be clearly understood by those skilled in the art from the following descriptions.

According to an aspect of the present disclosure, a display device includes a substrate including an active area and an inactive area which encloses the active area, a plurality of pixels which is disposed in the active area and a light emitting diode. The display device further includes a common voltage line which is disposed in the inactive area and is connected to the light emitting diode. The display device further includes an encapsulation unit which covers the active area and a part of the inactive area.

The display device further includes a touch sensing unit disposed on the encapsulation unit. The display device further includes an auxiliary line which is disposed on the encapsulation unit and is connected to the common voltage line. The touch sensing unit includes: a plurality of touch electrodes which includes a plurality of first touch electrodes and a plurality of second touch electrodes; and a bridge pattern which connects the plurality of first touch electrodes. The auxiliary line is formed of the same material as the bridge pattern and is disposed on the same layer as the bridge pattern and the auxiliary line is disposed in both the active area and the inactive area.

Other detailed matters of the exemplary aspects are included in the detailed description and the drawings.

According to the present disclosure, an influence of an electric field due to a potential difference between a high potential voltage and a low potential voltage may be minimized and a defect due to an excessive potential difference may be suppressed.

According to the present disclosure, a low potential voltage is set to be high by improving the low potential voltage rising to reduce the potential difference between a high potential voltage and a low potential voltage.

According to the present disclosure, local brightness phenomenon caused by applying a highly efficient light emitting diode may be improved.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
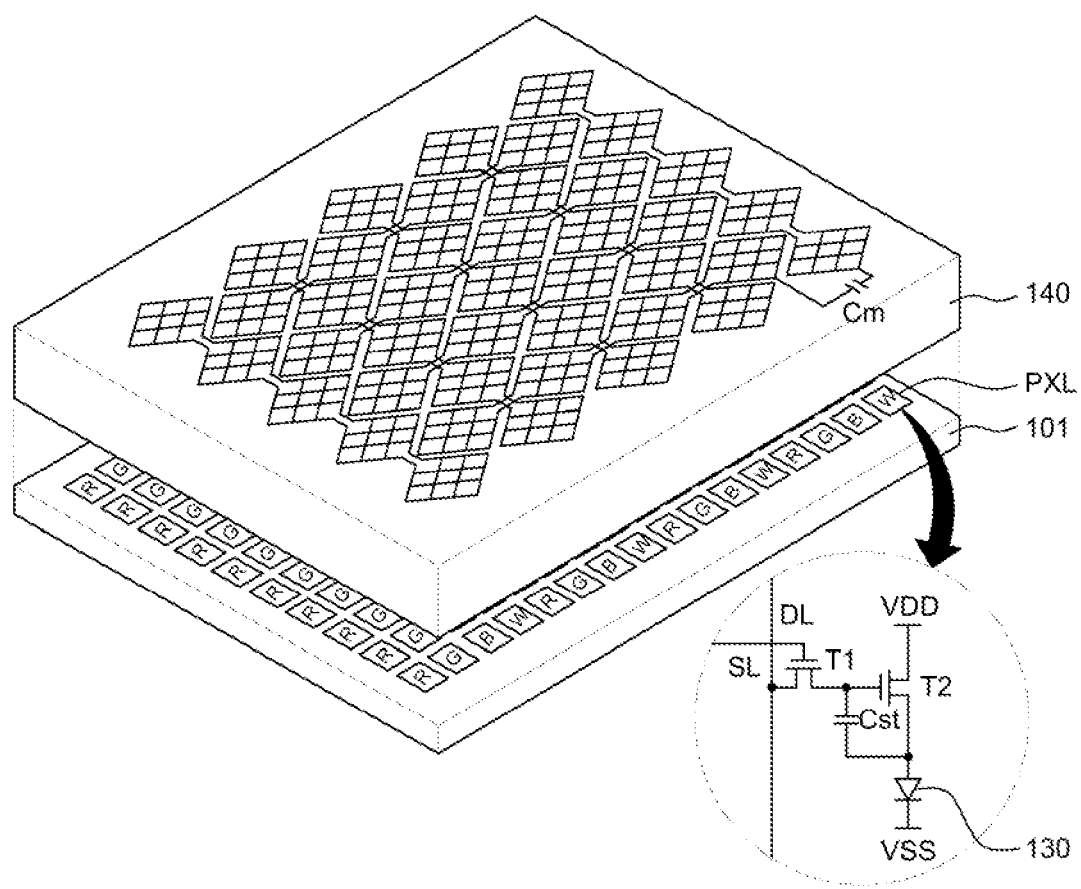
FIG. 1 is an exploded perspective view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, it may be directly on the another element or layer, or another layer or another element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Same reference numerals generally denote same elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

FIG. 1 is an exploded perspective view of a display device according to an exemplary aspect of the present disclosure. That is, FIG. 1 is an exploded perspective view illustrating a display device 100 having a touch sensor according to the present disclosure.

Figure 2:
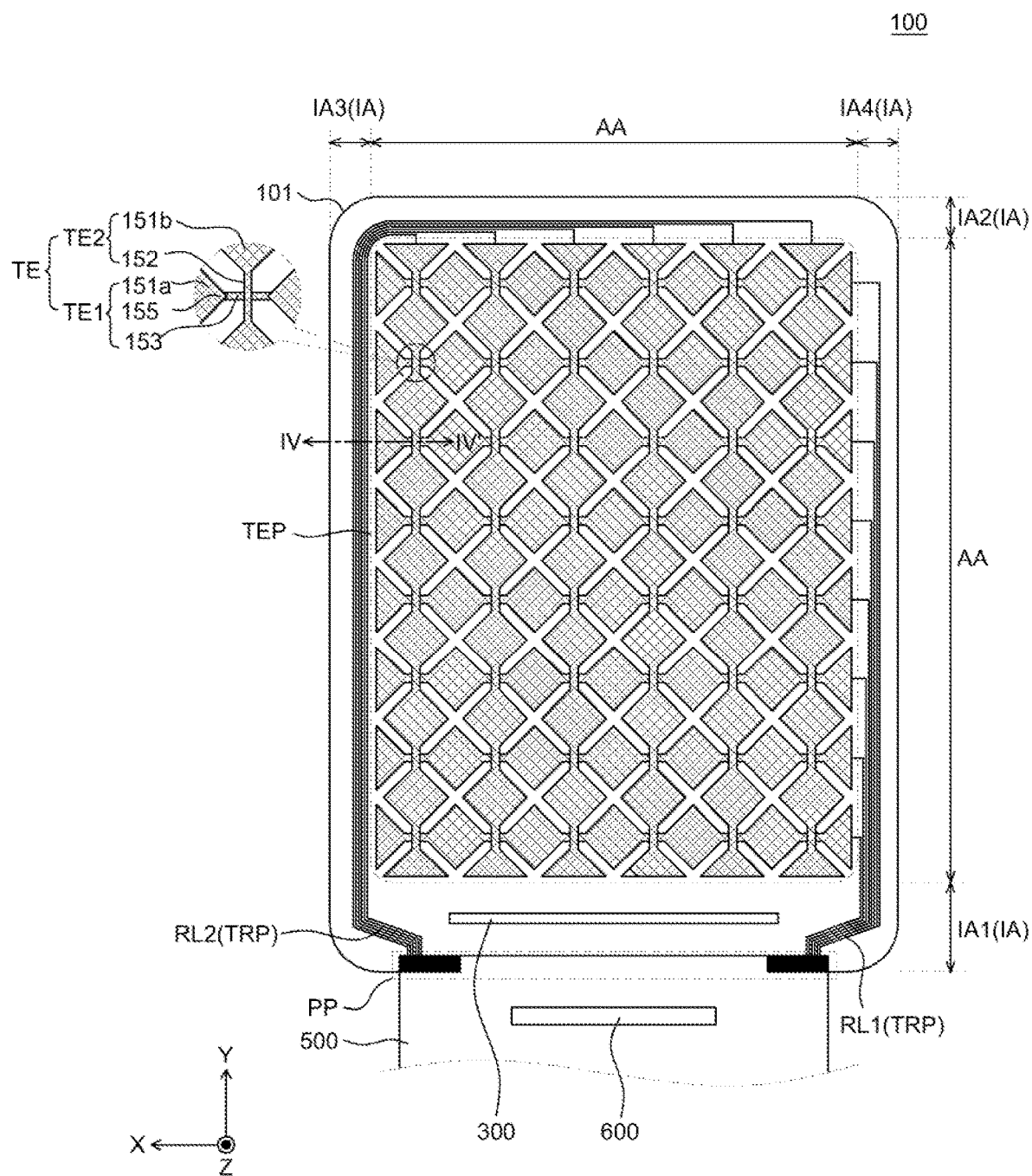
FIG. 2 is a schematic plan view of a display device according to an exemplary aspect of the present disclosure.

The display device 100 having a touch sensor illustrated in FIG. 1 senses a variation of a mutual capacitance Cm (touch sensor) by the touch of the user by means of touch electrodes TE1 and TE2 illustrated in FIG. 2, during a touch period, to sense the presence of touch and a touch position. The display device 100 having the touch sensor illustrated in FIG. 1 displays images by means of a unit pixel including a light emitting diode 130. The unit pixel is configured by red (R), green (G), and blue (B) sub pixels PXL or configured by red (R), green (G), blue (B), and white (W) sub pixels PXL.

To this end, the display device 100 illustrated in FIG. 1 includes a plurality of sub pixels PXL disposed on the substrate 101 in a matrix, an encapsulation unit 140 disposed on the plurality of sub pixels PXL, and a mutual capacitance Cm disposed on the encapsulation unit 140.

Each of the plurality of sub pixels PXL includes a pixel driving circuit and a light emitting diode 130 which is connected to the pixel driving circuit.

The pixel driving circuit includes a switching transistor T1, a driving transistor T2, and a storage capacitor Cst.

When a scan pulse is supplied to the scan line SL, the switching transistor T1 is turned on to supply a data signal, which is supplied to a data line DL, to the storage capacitor Cst and a gate electrode of the driving transistor T2.

The driving transistor T2 controls a current supplied from the high potential voltage line VDD to the light emitting diode 130 in response to the data signal supplied to the gate electrode of the driving transistor T2 to control an emission amount of the light emitting diode 130. Even though the switching transistor T1 is turned off, the driving transistor T2 supplies a constant current by a voltage charged in the storage capacitor Cst until a data signal of a subsequent frame is supplied so that the emission of the light emitting diode 130 is maintained.

FIG. 2 is a schematic plan view of a display device according to an exemplary aspect of the present disclosure. FIG. 2 is a view illustrating a touch screen-integrated display device 100 according to the exemplary aspect of the present disclosure and for the convenience of description, only a touch sensing unit is illustrated, among various components of the display device 100.

Referring to FIG. 2, the touch screen-integrated display device 100 according to the exemplary aspect of the present disclosure includes a substrate 101, a pixel array layer, an encapsulation unit, and a touch sensing unit.

The substrate 101 is a base substrate (or a base layer) and includes a plastic material or a glass material. The substrate 101 may have a planar quadrangular shape, a quadrangular shape with corners which are rounded with a predetermined radius of curvature, or a non-quadrangular shape having at least six sides. Here, the substrate 101 having a non-quadrangular shape may include at least one protrusion portion or at least one notch portion.

The substrate 101 may be divided into an active area AA and an inactive area IA.

The active area AA is provided in an intermediate area of the substrate 101 and is defined as an area in which images are displayed. The active area AA may have a quadrangular shape in the plan view, a quadrangular shape with corners which are rounded with a predetermined radius of curvature, or a non-quadrangular shape having at least six sides. Here, the active area AA having a non-quadrangular shape may include at least one protrusion portion or at least one notch portion.

The inactive area IA is provided at an edge area of the substrate 101 so as to enclose the active area AA and is defined as an area in which the image is not displayed or a peripheral area. The inactive area IA may include a first inactive area IA1 provided at a first edge of the substrate 101, a second inactive area IA2 provided at a second edge of the substrate 101 parallel to the first inactive area IA1, a third inactive area IA3 provided at a third edge of the substrate 101, and a fourth inactive area IA4 provided at a fourth edge of the substrate 101 parallel to the third inactive area IA3. For example, the first inactive area IA1 may be an upper (or lower) edge area of the substrate 101, the second inactive area IA2 is a lower (or upper) edge area of the substrate 101, the third inactive area IA3 is a left (or right) edge area of the substrate 101, and the fourth inactive area IA4 is a right (or left) edge area of the substrate 101. However, it is not necessarily limited thereto.

The pixel array layer may be provided on the active area AA of the substrate 101. The pixel array layer according to an exemplary aspect may include a scan line, a data line, a pixel driving power line, and a pixel.

The pixel is disposed in a pixel area defined in the active area AA of the substrate 101 and is electrically connected to the adjacent scan line and the data line and the pixel driving power line. Here, the pixel area may be defined by the intersection of the scan line and the data line.

The pixel may include a pixel circuit which is electrically connected to the adjacent scan line, the data line, and the pixel driving power line and a light emitting diode which is electrically connected to the pixel circuit.

The light emitting diode emits light by a data current supplied from the pixel circuit to emit light with a luminance corresponding to a data current. In this case, the data current may flow through a common power line from the pixel driving power line via the driving thin film transistor and the light emitting diode.

The light emitting diode may include a pixel driving electrode (or a first electrode) which is electrically connected to the pixel circuit, an emission layer formed on the pixel driving electrode, and a common electrode (or a second electrode) which is electrically connected to the emission layer.

The encapsulation unit is formed on the substrate 101 to enclose the pixel array layer and expose a part of the common power line provided in the inactive area IA of the substrate 101. The encapsulation unit may cover the active area AA and a part of the inactive area IA. The encapsulation unit may suppress oxygen or moisture from permeating the light emitting diode provided in the pixel array layer. The encapsulation unit according to an exemplary aspect may include at least one inorganic layer. An encapsulation layer according to another exemplary aspect may include a plurality of inorganic layers and an organic layer between the plurality of inorganic layers.

The touch sensing unit is disposed on the encapsulation unit and senses the touch according to a touch object. Here, the touch object may include a user's finger or a touch pen.

The touch sensing unit may include a touch electrode unit TEP and a touch routing unit TRP.

The touch electrode unit TEP may include a touch electrode TE disposed on the active area AA of the substrate 101.

The touch electrode TE may include a plurality of first touch electrodes TE1 and a plurality of second touch electrodes TE2.

The plurality of first touch electrodes TE1 extends along a first direction X to be disposed on the active area AA of the substrate 101 so as to be spaced apart from each other along a second direction Y. The plurality of first touch electrodes TE1 may be used as touch sensing electrodes (or touch driving electrodes) to sense a touch position of a touch object.

Each of the plurality of first touch electrode TE1 may include a plurality of first electrode patterns 151a and a plurality of bridge patterns 153.

Each of the plurality of first electrode patterns 151a is disposed on the active area AA of the substrate 101 to be spaced apart from each other along the first direction X.

Each of the plurality of bridge patterns 153 is disposed on the active area AA of the substrate 101 so as to be spaced apart from each other along the first direction X and electrically connects two first electrode patterns 151a which are adjacent to each other along the first direction X. Each of the plurality of bridge patterns 153 is disposed so as to overlap with two first electrode patterns 151a adjacent to each other along the first direction X to suppress the short of the first touch electrode TE1 and the second touch electrode TE2 in the intersecting area. Each of the plurality of bridge patterns 153 may be connected to the first touch electrode TE1 by means of a bridge contact hole 155.

One side of each of the plurality of bridge patterns 153 is electrically connected to a first electrode pattern 151a disposed at one side, between two first electrode patterns 151a which are adjacent to each other along the first direction X. The other side of each of the plurality of bridge patterns 153 is electrically connected to the first electrode pattern 151a disposed at the other side, between two first electrode patterns 151a which are adjacent to each other along the first direction X. Each of the plurality of bridge patterns 153 according to the exemplary aspect may be linearly formed, but is not limited thereto and may have various shapes such as a curved shape, a clamp shape, or a mesh shape to electrically connect two first electrode patterns 151a which are adjacent to each other along the first direction X.

The plurality of second touch electrodes TE2 extends along the second direction Y to be disposed on the active area AA of the substrate 101 so as to be electrically isolated from the plurality of first touch electrodes TE1 while being spaced apart from each other along the first direction X. The plurality of second touch electrodes TE2 may be used as touch driving electrodes (or touch sensing electrodes) to sense a touch position of the touch object.

Each of the plurality of second touch electrode TE2 may include a plurality of second electrode patterns 151b and a plurality of connection lines 152.

Each of the plurality of second electrode patterns 151b is disposed on the active area AA of the substrate 101 to be spaced apart from each other along the second direction Y.

Each of the plurality of connection lines 152 is disposed between two second electrode patterns 151b which are adjacent to each other along the second direction Y to electrically connect two second electrode patterns 151b which are adjacent to each other along the second direction Y. Each of the plurality of connection lines 152 may be disposed on the same layer as each of the plurality of second electrode patterns 151b. Accordingly, each of the plurality of connection lines 152 and each of the plurality of second electrode patterns 151b may be formed as one body. Each of the plurality of connection lines 152 is disposed so as to intersect each of the plurality of bridge patterns 153.

In the meantime, the plurality of bridge patterns 153 of the first touch electrode TE1 may be changed to the plurality of connection lines 152 of the second touch electrode TE2. The plurality of connection lines 152 of the second touch electrode TE2 may be changed to the plurality of bridge patterns 153 of the first touch electrode TE1.

The plurality of first touch electrodes TE1 and the plurality of second touch electrodes TE2 may include a mesh structure formed by intersecting metal lines having a very small line width. Here, the metal line may have a single-layered or a multiple-layered structure formed of a conductive material, such as molybdenum (Mo), silver (Ag), titanium (Ti), copper (Cu), aluminum (Al), titanium/aluminum/titanium (Ti/Al/Ti), and molybdenum/aluminum/molybdenum (Mo/Al/Mo).

Each of the plurality of first electrode patterns 151a and the plurality of second electrode patterns 151b may have a polygonal shape in the plan view, and for example, may have a rhombus shape. In this case, each of the electrode patterns 151a and 151b disposed along an edge portion of the active area AA has a triangular shape. Each of the plurality of first electrode patterns 151a and the plurality of second electrode patterns 151b may be simultaneously formed by a process of forming mesh type metal lines intersecting on the encapsulation layer and a process of forming the plurality of first electrode patterns 151a, the plurality of second electrode patterns 151b, and the plurality of connection lines 152 by cutting metal lines formed on a touch electrode boundary area which is set in advance on the active area AA.

The touch routing unit TRP is provided in the inactive area IA of the substrate 101 to be electrically connected to the touch electrode TE provided in the touch sensing unit. The touch routing unit TRP may include a plurality of first touch routing lines RL1 and a plurality of second touch routing lines RL2.

Each of the plurality of first touch routing lines RL1 may be connected to the plurality of first touch electrodes TE1 provided in the touch sensing unit one to one. Each of the plurality of first touch routing lines RL1 may be disposed over the other side of the first inactive area IA1 and the fourth inactive area IA4 (or the third inactive area IA3) of the substrate 101. One end of each of the plurality of first touch routing lines RL1 may be connected to the plurality of first touch electrodes TE1 in the fourth inactive area IA4 (or the third inactive area IA3) of the substrate 101 one to one.

Each of the plurality of second touch routing lines RL2 may be connected to the plurality of second touch electrodes TE2 provided in the touch sensing unit one to one. Each of the plurality of second touch routing lines RL2 may be disposed over one side of the first inactive area IA1, the second inactive area IA2, and the third inactive area IA3 (or the fourth inactive area IA4) of the substrate 101. One end of each of the plurality of second touch routing lines RL2 according to the exemplary aspect may be connected to the plurality of second touch electrodes TE2 in the second inactive area IA2 of the substrate 101 one to one.

The touch screen-integrated display device 100 according to the exemplary aspect of the present disclosure may further include a pad portion PP, a driving integrated circuit 300, a flexible circuit cable 500, and a touch driving circuit 600.

The pad portion PP may include a plurality of pads provided in the inactive area IA of the substrate 101. The pad portion PP according to the exemplary aspect may include a plurality of common power supply pads, a plurality of data input pads, a plurality of power supply pads, a plurality of control signal input pads, and a plurality of touch driving pads, provided in the first inactive area IA1 of the substrate 101.

The driving integrated circuit 300 is mounted in a chip mounting area defined in the first inactive area IA1 of the substrate 101 by a chip mounting (or bonding) process. Input terminals of the driving integrated circuit 300 are electrically connected to the pad portion PP and input terminals of the driving integrated circuit 300 are electrically connected to the plurality of data lines and the plurality of pixel driving power lines provided in the active area AA. The driving integrated circuit 300 receives various powers, timing synchronization signals, and digital image data input from the display driving circuit unit (or a host circuit) by means of the pad portion PP. The driving integrated circuit 300 generates a gate control signal in accordance with the timing synchronization signals to control the driving of the gate driving circuit. Simultaneously, the driving integrated circuit 300 converts digital image data into an analog pixel data voltage to supply the analog pixel data voltage to a corresponding data line.

The flexible circuit cable 500 is attached to the pad portion PP. The flexible circuit cable 500 electrically connects a display driving circuit unit and the pad portion PP and electrically connects the pad portion PP and the touch driving circuit 600.

The touch driving circuit 600 is mounted in the flexible circuit cable 500 by the chip mounting (or bonding) process. The touch driving circuit 600 is electrically connected to the other end of each of the plurality of first touch routing lines RL1 and the other end of each of the plurality of second touch routing lines RL2 by means of the plurality of touch driving pads provided on the pad portion PP. The touch driving circuit 600 supplies a touch driving pulse to each of the plurality of second touch electrodes TE2 by means of the pad portion PP and the plurality of second touch routing lines RL2 in response to a touch synchronization signal provided from a host circuit. Further, the touch driving circuit 600 senses a change in a capacitance between the first touch electrode TE1 and the second touch electrode TE2 by means of the pad portion PP and the plurality of first touch routing lines RL1 to generate touch raw data and provides the generated touch raw data to the host circuit. The host circuit calculates touch position information about a touch object based on the touch raw data which is provided from the touch driving circuit 600 during a touch report period and executes an application program linked to the calculated touch position information.

Selectively, the touch driving circuit 600 may be embedded in the driving integrated circuit 300 and in this case, the other end of each of the plurality of first touch routing lines RL1 and the plurality of second touch routing lines RL2 is not connected to the pad portion PP, but is electrically connected to the driving integrated circuit 300. The driving integrated circuit 300 supplies a touch driving pulse to each of the plurality of second touch electrodes TE2 by means of the plurality of second touch routing lines RL2 in response to a touch synchronization signal provided from the host circuit. Further, the touch driving circuit 600 senses a change in a capacitance between the first touch electrode TE1 and the second touch electrode TE2 by means of the plurality of first touch routing lines RL1 to generate touch raw data and provides the generated touch raw data to the host circuit by means of the pad portion PP.

Figure 3A:
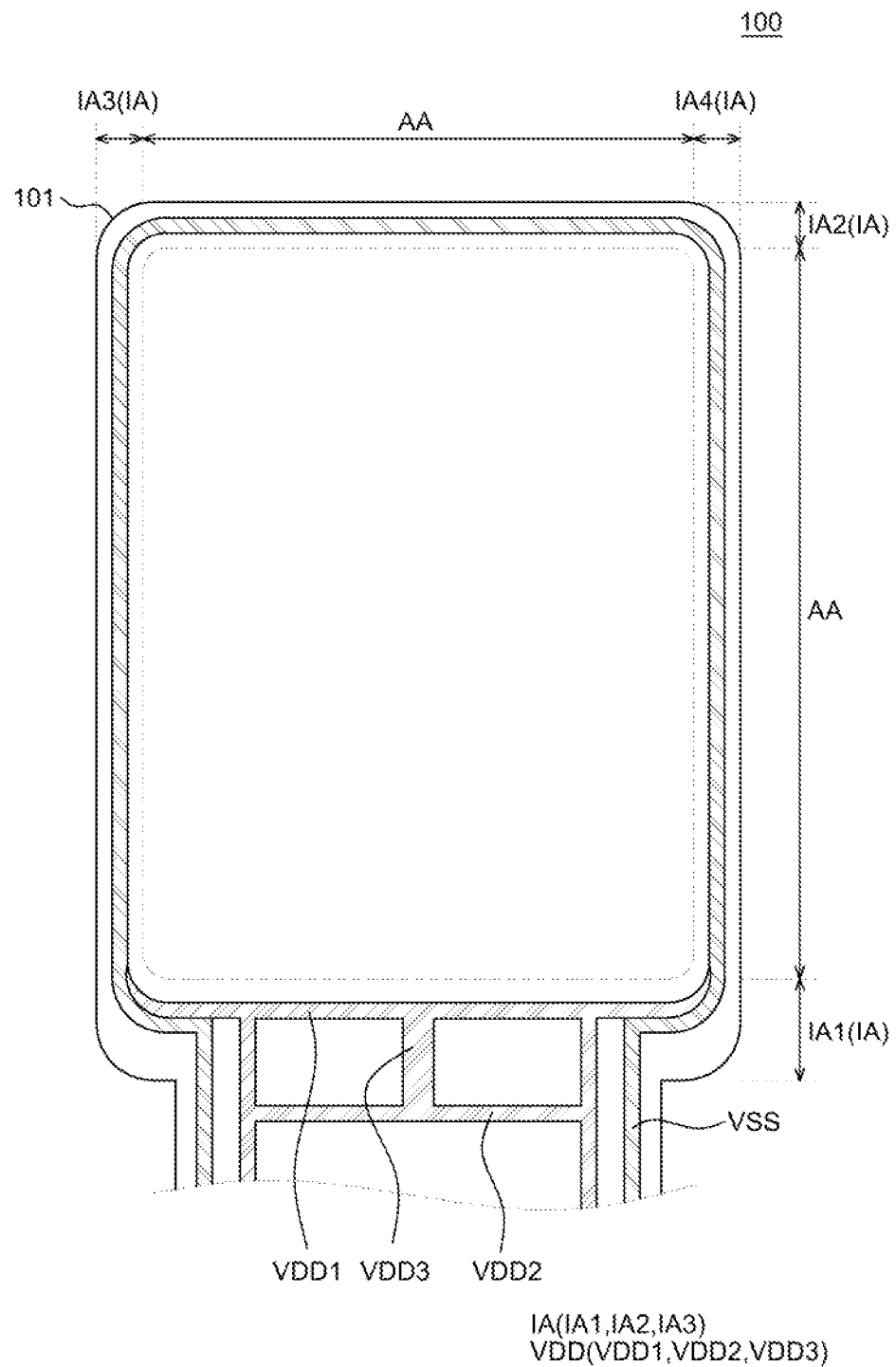
FIGS. 3A and 3B are schematic plan views of a display device according to an exemplary aspect of the present disclosure.
Figure 3B:
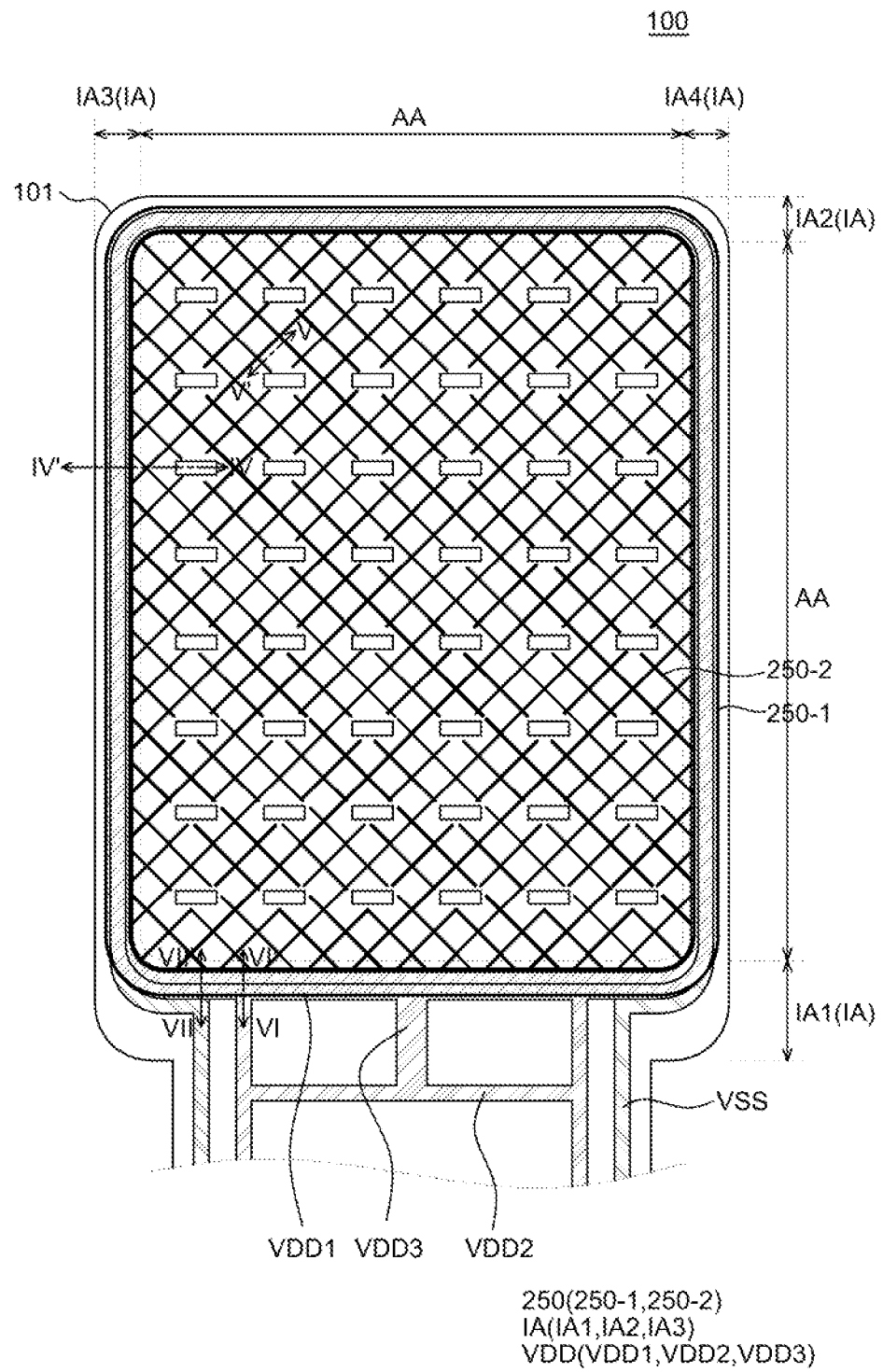

FIGS. 3A and 3B are schematic plan views of a display device according to an exemplary aspect of the present disclosure. For the convenience of description, in FIG. 3A, among various components of the display device 100, only a high potential voltage line VDD and a common voltage line VSS are illustrated and in FIG. 3B, only a high potential voltage line VDD, a common voltage line VSS, and an auxiliary line 250 are illustrated.

As described above, the data current which is supplied to the pixel may flow through a common voltage line VSS from the pixel driving power line via the driving thin film transistor and the light emitting diode. Therefore, the common voltage line VSS is disposed on the inactive area IA of the substrate 101 and is electrically connected to the common electrode disposed on the active area AA.

The common voltage line VSS is disposed along second to fourth inactive areas IA2, IA3, and IA4 adjacent to the active area AA of the substrate 101 with a constant line width and encloses a remaining portion excluding a part of the active area AA adjacent to the first inactive area IA1 of the substrate 101. One end of the common voltage line VSS may be disposed on one side of the first inactive area IA1 and the other end of the common voltage line VSS may be disposed on the other side of the first inactive area IA1. An area between one end and the other end of the common voltage line VSS may be disposed so as to enclose the second to fourth inactive areas IA2, IA3, and IA4. Accordingly, the common voltage line VSS according to the exemplary aspect may have an inverted "U" shape in which one side corresponding to the first inactive area IA1 of the substrate 101 is open in the plan view.

Next, a pixel may be supplied with a high potential voltage by means of the high potential voltage line VDD disposed in the inactive area IA. The high potential voltage line VDD may be supplied with a high potential voltage from a power supply pad disposed in the pad portion PP to transmit the high potential voltage along the plurality of power lines disposed in the active area AA.

The high potential voltage line VDD may be disposed in the first inactive area IA1 of the inactive area IA. That is, the high potential voltage line VDD may be disposed in the first inactive area IA1 so as to enclose one side of the active area AA. The high potential voltage line VDD may include a first high potential voltage line VDD1, a second high potential voltage line VDD2, and a third high potential voltage line VDD3. The first high potential voltage line VDD1 and the second high potential voltage line VDD2 extend in the same direction as the driving integrated circuit 300 or the touch driving circuit 600 of FIG. 2. The third high potential voltage line VDD3 extends in a direction perpendicular thereto to connect the first high potential voltage line VDD1 and the second high potential voltage line VDD2. At this time, the second high potential voltage line VDD2 may be adjacent to the pad portion PP and the first high potential voltage line VDD1 may be adjacent to the active area AA.

When the first high potential voltage line VDD1 adjacent to the active area AA has a shape corresponding to the different shaped corner area of the substrate 101 and the active area AA, the first high potential voltage line VDD1 may have a shape corresponding to the shape of the active area AA and the substrate 101 in a different shaped corner area. That is, as illustrated in FIG. 3A, when the corner area of the substrate 101 and the active area AA has a round shape, a width of the first high potential voltage line VDD1 in the different shaped corner area may be smaller than a width in a center area. Further, the first high potential voltage line VDD1 may be disposed to be more adjacent to one side of the active area AA than the common voltage line VSS. That is, in the different shaped corner area of the first inactive area IA1 in which both the first high potential voltage line VDD1 and the common voltage line VSS are disposed, the first high potential voltage line VDD1 may be disposed to be closer to the inside than the common voltage line VSS. However, the shape of the high potential voltage line VDD is not limited thereto.

Referring to FIG. 3B, the display device 100 according to the exemplary aspect of the present disclosure may further include an auxiliary line 250 which is connected to the common voltage line VSS. The auxiliary line 250 is formed of the same material as the bridge pattern 153 of the touch sensing unit and may be disposed on the same layer as the bridge pattern 153. The auxiliary line 250 may be formed together with the bridge pattern 153 of the touch sensing unit without an additional separate process.

The auxiliary line 250 may be disposed in both the active area AA and the inactive area IA. The auxiliary line 250 may include a first auxiliary line 250-1 which is disposed in the inactive area IA to be connected to the common voltage line VSS and a second auxiliary line 250-2 which is connected to the first auxiliary line 250-1 to be disposed in the active area AA.

The first auxiliary line 250-1 is formed to overlap with the common voltage line VSS disposed along the inactive area IA of the substrate 101 to be electrically connected to the common voltage line VSS. The first auxiliary line 250-1 may be disposed in the inactive area IA so as to enclose the active area AA. That is, the first auxiliary line 250-1 is disposed along the first to fourth inactive areas IA1, IA2, IA3, and IA4 of the substrate 101 in the plan view to have a closed loop shape. The common voltage line VSS may be electrically connected to the entire area overlapping with the first auxiliary line 250-1, but is not necessarily limited thereto, and may be electrically connected in each of the plurality of contact areas which is set with a predetermined interval along a length direction of the first auxiliary line 250-1.

The first auxiliary line 250-1 has a closed loop shape which encloses the active area AA so that the first auxiliary line 250-1 may overlap with not only the common voltage line VSS (hereinafter referred to as a low potential voltage line VSS), but also a partial area of the high potential voltage line VDD. The first auxiliary line 250-1 may be disposed on the first high potential voltage line VDD1 so as to overlap with the first high potential voltage line VDD1 in the area of the high potential voltage line VDD. However, the first auxiliary line 250-1 is not electrically connected to the high potential voltage line VDD, but may be disposed so as to be opposite to the first high potential voltage line VDD1 with an insulating layer therebetween.

The second auxiliary line 250-2 is disposed in the active area AA of the substrate 101 and may be connected to the first auxiliary line 250-1. The second auxiliary line 250-2 may be formed with a mesh pattern in the active area AA as illustrated in FIG. 3B. As the second auxiliary line 250-2 is formed with a mesh pattern, the second auxiliary line may overlap with the mesh pattern of the plurality of touch electrodes TE.

However, the auxiliary line 250 is formed on the same layer as the bridge pattern 153 of the touch sensing unit so that when the second auxiliary line 250-2 is disposed in the active area AA, there may be an area overlapping with the bridge pattern 153 of the touch sensing unit. Accordingly, in the display device 100 of the present disclosure, the second auxiliary line 250-2 may be electrically isolated from the bridge pattern 153 of the touch sensing unit. That is, the second auxiliary line 250-2 is avoidably designed in the active area excluding an area in which the bridge pattern 153 is disposed to be spaced apart from the bridge pattern 153. Even though the second auxiliary line 250-2 and the bridge pattern 153 are formed of the same material on the same layer, as illustrated in FIG. 3B, the second auxiliary line 250-2 may be disconnected in an area adjacent to the bridge pattern 153.

Hereinafter, components of the display device 100 according to an exemplary aspect of the present disclosure will be described in more detail with reference to FIGS. 4 to 7 together.

Figure 4:
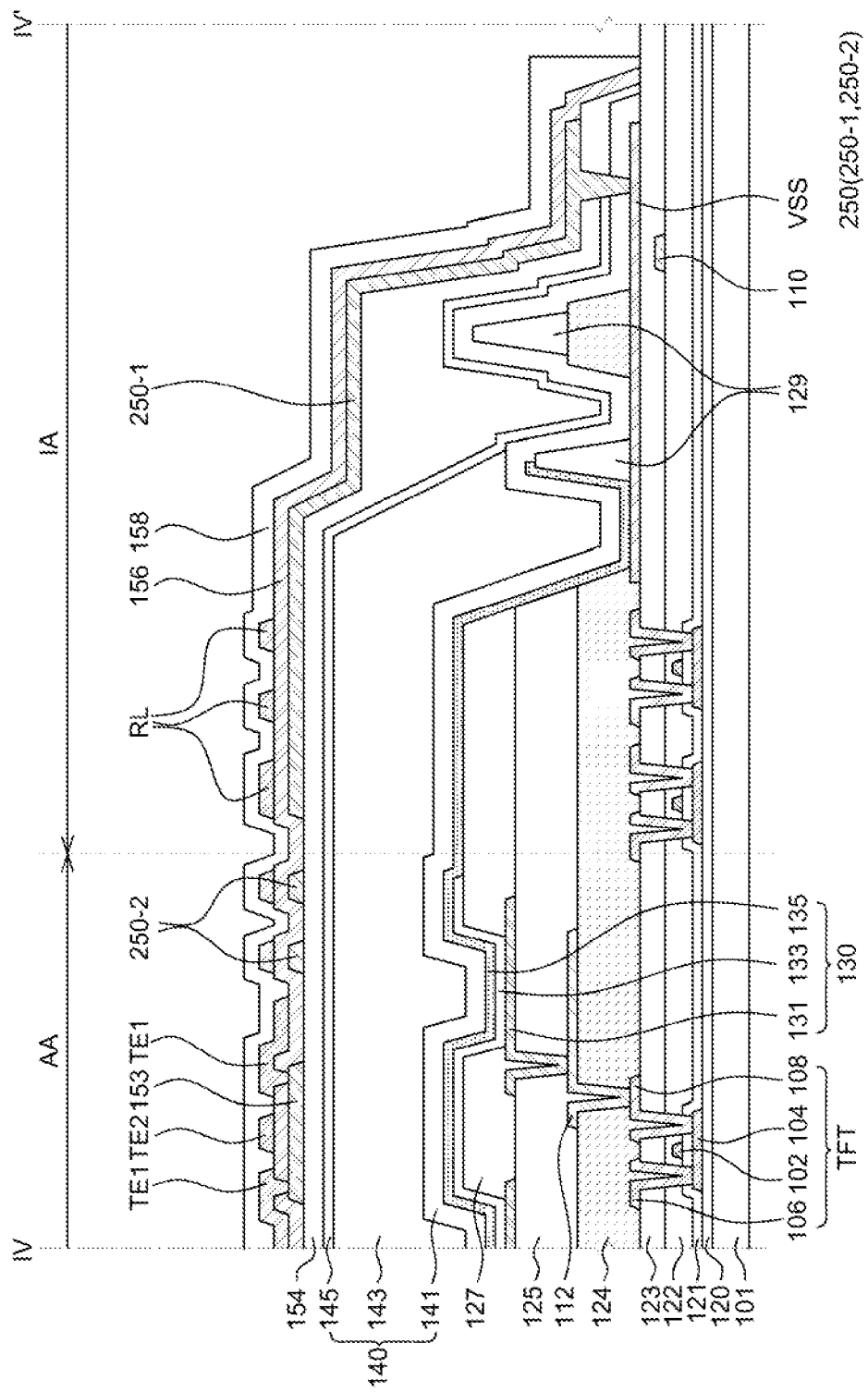
FIG. 4 is a cross-sectional view taken along line IV-IV' of FIGS. 2 and 3B.

FIG. 4 is a cross-sectional view taken along line IV-IV' of FIGS. 2 and 3B.

Referring to FIG. 4, the display device 100 according to the exemplary aspect of the present disclosure includes a substrate 101, a buffer layer 120, a thin film transistor TFT, a gate insulating layer 121, a first interlayer insulating layer 122, a conductive layer 110, a second interlayer insulating layer 123, a first planarization layer 124, a connection electrode 112, a second planarization layer 125, a bank 127, a light emitting diode 130, an encapsulation unit 140, a touch buffer layer 154, a touch insulating layer 156, a touch sensing unit, an auxiliary line 250, and a common voltage line VSS.

The substrate 101 may support various components of the display device 100. The substrate 101 may be formed of glass or a plastic material having flexibility. When the substrate 101 is formed of a plastic material, for example, the substrate may be formed of polyimide (PI).

The buffer layer 120 may be disposed on the substrate 101. The buffer layer 120 may be formed by a single layer of silicon nitride SiNx or silicon oxide SiOx or a multilayer thereof. The buffer layer 120 may serve to improve adhesiveness between layers formed on the buffer layer 120 and the substrate 101 and block alkali components leaked from the substrate 101.

The thin film transistor TFT may be disposed on the buffer layer 120. The thin film transistor TFT may include an active layer 104, a gate electrode 102, a source electrode 106, and a drain electrode 108. Here, depending on the design of the pixel circuit, the source electrode 106 may serve as a drain electrode and the drain electrode 108 may serve as a source electrode. The active layer 104 of the thin film transistor TFT may be disposed on the buffer layer 120.

The active layer 104 may be formed of various materials, such as polysilicon, amorphous silicon, or oxide semiconductor. The active layer 104 may include a channel region in which a channel is formed when the thin film transistor TFT is driven and a source region and a drain region on both sides of the channel region. The source region refers to a portion of the active layer 104 which is connected to the source electrode 106 and the drain region refers to a portion of the active layer 104 which is connected to the drain electrode 108.

The gate insulating layer 121 may be disposed on the active layer 104 of the thin film transistor TFT. The gate insulating layer 121 may be formed as a single layer of silicon nitride SiNx or silicon oxide SiOx or a multilayer thereof. In the gate insulating layer 121, a contact hole through which the source electrode 106 and the drain electrode 108 of the thin film transistor TFT are connected to the source region and the drain region of the active layer 104 of the thin film transistor TFT, respectively, may be formed.

The gate electrode 102 of the thin film transistor TFT may be disposed on the gate insulating layer 121. The gate electrode 102 may be formed of a single layer or a multilayer formed of any one of molybdenum (Mo), copper (Cu), titanium (Ti), aluminum (Al), chrome (Cr), gold (Au), nickel (Ni), and neodymium (Nd) or an alloy thereof. The gate electrode 102 may be formed on the gate insulating layer 121 so as to overlap with the channel region of the active layer 104 of the thin film transistor TFT.

The first interlayer insulating layer 122 may be disposed on the gate insulating layer 121 and the gate electrode 102. The first interlayer insulating layer 122 may be configured by a single layer of silicon nitride SiNx or silicon oxide SiOx or a multilayer thereof. A contact hole through which the source region and the drain region of the active layer 104 of the thin film transistor TFT are exposed may be formed in the first interlayer insulating layer 122.

The conductive layer 110 may be disposed on the first interlayer insulating layer 122. The conductive layer 110 may be a wiring line or an electrode disposed between the gate electrode 102 and the source electrode 106 and the drain electrode 108.

The second interlayer insulating layer 123 may be disposed on the first interlayer insulating layer 122 and the conductive layer 110. The second interlayer insulating layer 123 may be formed of the same material as the first interlayer insulating layer 122. That is, the second interlayer insulating layer 123 may be configured by a single layer of silicon nitride SiNx or silicon oxide SiOx or a multilayer thereof. A contact hole through which the source region and the drain region of the active layer 104 of the thin film transistor TFT are exposed may be formed in the second interlayer insulating layer 123.

The source electrode 106 and the drain electrode 108 of the thin film transistor TFT may be disposed on the second interlayer insulating layer 123.

The source electrode 106 and the drain electrode 108 of the thin film transistor TFT may be connected to the active layer 104 of the thin film transistor TFT through the contact holes formed in the gate insulating layer 121, the first interlayer insulating layer 122, and the second interlayer insulating layer 123. Therefore, the source electrode 106 of the thin film transistor TFT may be connected to the source region of the active layer 104 through the contact holes formed in the gate insulating layer 121, the first interlayer insulating layer 122, and the second interlayer insulating layer 123. Therefore, the drain electrode 108 of the thin film transistor TFT may be connected to the drain region of the active layer 104 through the contact holes formed in the gate insulating layer 121, the first interlayer insulating layer 122, and the second interlayer insulating layer 123.

The source electrode 106 and the drain electrode 108 of the thin film transistor TFT may be formed by the same process. Further, the source electrode 106 and the drain electrode 108 of the thin film transistor TFT may be formed of the same material. The source electrode 106 and the drain electrode 108 of the thin film transistor TFT may be formed of a single layer or a multilayer formed of any one of molybdenum (Mo), copper (Cu), titanium (Ti), aluminum (Al), chrome (Cr), gold (Au), nickel (Ni), and neodymium (Nd) or an alloy thereof.

The first planarization layer 124 may be disposed on the source electrode 106, the drain electrode 108, and the second interlayer insulating layer 123. As illustrated in FIG. 4, a contact hole may be formed in the first planarization layer 124 to expose the drain electrode 108. The first planarization layer 124 may be an organic material layer which planarizes an upper portion of the thin film transistor TFT. For example, the first planarization layer 124 may be formed of an organic material, such as acryl resin, epoxy resin, phenolic resin, polyamide resin, or polyimide resin. However, it is not limited thereto and the first planarization layer 124 may be an inorganic material layer for protecting the thin film transistor TFT. For example, the first planarization layer 124 may be formed of an inorganic material such as silicon nitride SiNx or silicon oxide SiOx. The first planarization layer 124 may be configured by a single layer of silicon nitride SiNx or silicon oxide SiOx or a multilayer thereof.

The connection electrode 112 may be disposed on the first planarization layer 124. The connection electrode 112 may be connected to the drain electrode 108 of the thin film transistor TFT through the contact hole of the first planarization layer 124. The connection electrode 112 may serve to electrically connect the thin film transistor TFT and the light emitting diode 130. For example, the connection electrode 112 may serve to electrically connect the drain electrode 108 of the thin film transistor TFT and a first electrode 131 of the light emitting diode 130. The connection electrode 112 may be formed of a single layer or a multiple layer formed of any one of molybdenum (Mo), copper (Cu), titanium (Ti), aluminum (Al), chrome (Cr), gold (Au), nickel (Ni), and neodymium (Nd) or an alloy thereof. The connection electrode 112 may be formed of the same material as the source electrode 106 and the drain electrode 108 of the thin film transistor TFT.

The second planarization layer 125 may be disposed on the connection electrode 112 and the first planarization layer 124. Further, as illustrated in FIG. 4, a contact hole may be formed in the second planarization layer 125 to expose the connection electrode 112. The second planarization layer 125 may be an organic material layer which planarizes an upper portion of the thin film transistor TFT. For example, the second planarization layer 125 may be formed of an organic material, such as acryl resin, epoxy resin, phenolic resin, polyamide resin, or polyimide resin.

The light emitting diode 130 may be disposed on the second planarization layer 125. The light emitting diode 130 may include a first electrode 131, an emission structure 133, and a second electrode 135. The first electrode 131 of the light emitting diode 130 may be disposed on the second planarization layer 125. The first electrode 131 may be electrically connected to the connection electrode 112 through the contact hole formed in the second planarization layer 125. Therefore, the first electrode 131 of the light emitting diode 130 may be electrically connected to the connection electrode 112 through the contact hole formed in the second planarization layer 125 to be electrically connected to the thin film transistor TFT.

The first electrode 131 may be formed to have a multi-layered structure including a transparent conductive layer and an opaque conductive layer having a high reflection efficiency. The transparent conductive layer may be formed of a material having a relatively high work function, such as indium tin oxide (ITO) and indium zinc oxide (IZO). The opaque conductive layer may be formed of a single-layered or a multi-layered structure including Al, Ag, Cu, Pb, Mo, Ti, or an alloy thereof. For example, the first electrode 131 may be formed to have a structure in which a transparent conductive layer, an opaque conductive layer, and a transparent conductive layer are sequentially laminated. However, the first electrode is not limited thereto, but may also be formed to have a structure in which the transparent conductive layer and the opaque conductive layer are sequentially laminated.

Since the display device 100 according to the exemplary aspect of the present disclosure is a top emission display device, the first electrode 131 may be an anode electrode. When the display device 100 is a bottom emission type, the first electrode 131 disposed on the second planarization layer 125 may be a cathode electrode.

The bank 127 may be disposed on the first electrode 131 and the second planarization layer 125. An opening may be formed in the bank 127 to expose the first electrode 131. Since the bank 127 may define an emission area of the display device 100, the bank may also be referred to as a pixel definition layer.

The emission structure 133 including an emission layer may be disposed on the first electrode 131.

The emission structure 133 of the light emitting diode 130 may be formed by laminating a hole layer, an emission layer, and an electron layer on the first electrode 131 in this order or a reverse order. Further, the emission structure 133 may include first and second emission structures which are opposite to each other with a charge generating layer therebetween. In this case, any one emission layer of the first and second emission structures generates blue light and the other emission layer of the first and second emission structures generates yellow-green light so that white light may be generated by the first and the second emission structures. The white light generated in the emission structure 133 is incident onto a color filter disposed above the emission structure 133 to implement color images. In addition, individual emission structures 133 may generate color light corresponding to individual sub pixels without having separate color filters to implement color images. For example, the emission structure 133 of a red R sub pixel may generate red light, the emission structure 133 of a green G sub pixel may generate green light, and the emission structure 133 of a blue B sub pixel may generate blue light.

The second electrode 135 may be further disposed on the emission structure 133. The second electrode 135 of the light emitting diode 130 may be disposed on the emission structure 133 so as to be opposite to the first electrode 131 with the emission structure 133 therebetween. In the display device 100 according to the exemplary aspect of the present disclosure, the second electrode 135 may be a cathode electrode. The encapsulation unit 140 may be further disposed on the second electrode 135 to suppress moisture permeation.

The encapsulation unit 140 may include a first inorganic encapsulation layer 141, an organic encapsulation layer 143, and a second inorganic encapsulation layer 145. The first inorganic encapsulation layer 141 of the encapsulation unit 140 may be disposed on the second electrode 135. The organic encapsulation layer 143 may be disposed on the first inorganic encapsulation layer 141. Further, the second inorganic encapsulation layer 145 may be disposed on the organic encapsulation layer 143. The first inorganic encapsulation layer 141 and the second inorganic encapsulation layer 145 of the encapsulation unit 140 may be formed of an inorganic material, such as silicon nitride SiNx or silicon oxide SiOx. The organic encapsulating layer 143 of the encapsulating unit 140 may be formed of an organic material, such as acryl resin, epoxy resin, phenolic resin, polyamide resin, or polyimide resin.

The second inorganic encapsulation layer 145 may cover upper surfaces and side surfaces of the first inorganic encapsulation layer 141 and the organic encapsulation layer 143. The second inorganic encapsulation layer 145 minimizes or blocks external moisture or oxygen from permeating the first inorganic encapsulation layer 141 and the organic encapsulation layer 143. At this time, the first inorganic encapsulation layer 141 and the second inorganic encapsulation layer 145 serve to block the permeation of moisture or oxygen and the organic encapsulation layer 143 serves to planarize an upper portion of the first inorganic encapsulation layer 141. Therefore, the encapsulation unit 140 may cover the active area AA and the gate driving circuit and the dam of the inactive area IA, but a configuration of the encapsulation unit 140 is not limited thereto.

The touch buffer layer 154 which is in contact with the second inorganic encapsulation layer 145 to be formed below the bridge pattern 153 may be disposed above the encapsulation unit 140. The touch buffer layer 154 may serve to suppress the damage of the electrode of the pad portion which is exposed when the bridge pattern 153 is formed. The touch buffer layer 154 may be formed of an inorganic material, for example, silicon oxide SiOx or silicon nitride SiNx, but is not limited thereto, and may be formed of an organic material. When the electrode of the pad portion is protected not by the touch buffer layer 154, but by the other insulating layer, the touch buffer layer 154 may not be formed.

The touch sensing unit may be disposed on the touch buffer layer 154. The touch sensing unit may include touch electrodes TE1 and TE2 and the bridge pattern 153.

The bridge pattern 153 of the touch sensing unit may be disposed on the touch buffer layer 154. The bridge pattern 153 is disposed in the intersection of the touch electrodes TE1 and TE2 disposed in different directions to be used to connect the touch electrodes TE1 and TE2 disposed in one direction. The bridge pattern 153 may be formed of a transparent conductive layer and for example, formed of a transparent conductive oxide, such as ITO or IZO.

A touch insulating layer 156 may be disposed on the touch buffer layer 154 and the bridge pattern 153. The touch insulating layer 156 may insulate the bridge pattern 153 from the touch electrodes TE1 and TE2. The touch insulating layer 156 may be formed of an inorganic material layer or an organic material layer. When the touch insulating layer 156 is an inorganic material layer, the touch insulating layer 156 may be configured as a single layer of silicon nitride SiNx or silicon oxide SiOx or a multilayer thereof. When the touch insulating layer 156 is an organic material layer, the touch insulating layer 156 may be formed of an organic material, such as acryl resin, epoxy resin, phenolic resin, polyamide resin, or polyimide resin. A contact hole may be formed in the touch insulating layer 156 to expose the bridge pattern 153.

The plurality of first touch electrodes TE1 and the plurality of second touch electrodes TE2 of the touch sensing unit may be disposed on the touch insulating layer 156. The plurality of first touch electrodes TE1 may be connected to the bridge pattern 153 by means of the contact hole of the touch insulating layer 156. The plurality of first touch electrodes TE1 may be connected to each other by the bridge pattern 153.

The first touch electrode TE1 and the second touch electrode TE2 of the touch sensing unit may be formed of a transparent conductive layer such as indium-tin-oxide (ITO) or indium-zinc-oxide (IZO). However, it is not limited thereto and the first touch electrode TE1 and the second touch electrode TE2 may be formed of an opaque conductive layer having an opening. When the first touch electrode TE1 and the second touch electrode TE2 are formed of an opaque conductive layer having an opening, the first touch electrode TE1 and the second touch electrode TE2 may be formed of a single layer or a multilayer formed of any one of molybdenum (Mo), copper (Cu), titanium (Ti), aluminum (Al), chrome (Cr), gold (Au), nickel (Ni), and neodymium (Nd) or an alloy thereof.

In the inactive area IA, the touch routing line RL is formed of the same material as the touch electrodes TE1 and TE2 and disposed on the same layer as the touch electrodes TE1 and TE2. The touch routing line RL is electrically connected to the touch electrodes TE1 and TE2 to be supplied with a signal from the plurality of touch driving pads among the pads disposed in the pad portion PP to transmit the signal to the touch electrodes TE1 and TE2.

A second touch insulating layer 158 may be disposed on the touch electrodes TE1 and TE2, the touch routing line RL, and the touch insulating layer 156. The second touch insulating layer 158 may be formed of an inorganic material, for example, formed of silicon oxide or silicon nitride.

Next, in the inactive area IA, the common voltage line VSS which is connected to the second electrode 135 may be disposed. The common voltage line VSS may be disposed along second to fourth inactive areas IA2, IA3, and IA4 adjacent to the active area AA of the substrate 101 with a constant line width and enclose a remaining portion excluding a part of the first inactive area IA1 adjacent to the active area AA of the substrate 101. The common voltage line VSS may be electrically connected to the second electrode 135 of the light emitting diode 130.

The dam 129 may be disposed on the common voltage line VSS. The dam 129 may be disposed in the inactive area IA to suppress the organic encapsulation layer 143 of the encapsulation unit 140 from overflowing to the outside of the display device 100. The encapsulation unit 140 and the touch buffer layer 154 may be disposed above the dam 129.

The bridge pattern 153 and the auxiliary line 250 may be disposed on the touch buffer layer 154. The auxiliary line 250 may be disposed in both the active area AA and the inactive area IA. The auxiliary line 250 disposed in the active area AA is separated from the bridge pattern 153 as a second auxiliary line 250-2 to be disposed with the mesh pattern. The auxiliary line 250 disposed in the inactive area IA is the first auxiliary line 250-1 and may be disposed so as to enclose the active area AA. The first auxiliary line 250-1 may be electrically connected to the common voltage line VSS to be closer to the outside of the substrate 101 than the dam 129. Referring to FIG. 4, the first auxiliary line 250-1 may be connected to the common voltage line VSS by means of the contact hole formed in the encapsulation unit 140 and the touch buffer layer 154.

Figure 5:
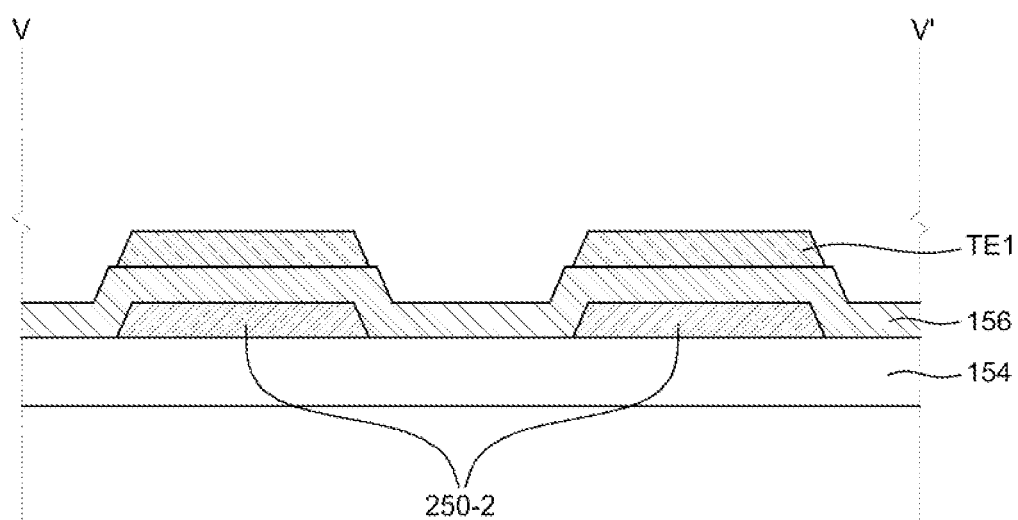
FIG. 5 is a cross-sectional view taken along line V-V of FIG. 3B.

FIG. 5 is a cross-sectional view taken along line V-V' of FIG. 3B and for the convenience of description, among various components of the display device 100, only a touch buffer layer 154, a second auxiliary line 250-2, a touch insulating layer 156, and a first touch electrode TE1 are illustrated.

In the active area AA, the touch electrode TE is disposed and the touch electrode TE may include a plurality of first touch electrodes TE1 and a plurality of second touch electrodes TE2. The plurality of first touch electrodes TE1 and the plurality of second touch electrodes TE2 extend in the X direction and the Y direction, respectively, to intersect each other. That is, the plurality of first touch electrodes TE1 and the plurality of second touch electrodes TE2 may be disposed with a mesh pattern.

The auxiliary line 250 may include a first auxiliary line 250-1 and a second auxiliary line 250-2 and in the active area AA, the second auxiliary line 250-2 which is connected to the first auxiliary line 250-1 may be disposed. Like the plurality of touch electrodes TE1 and TE2, the second auxiliary line 250-2 may be formed with the mesh pattern.

Accordingly, the mesh pattern of the second auxiliary line 250-2 may overlap with the mesh pattern of the plurality of touch electrodes TE1 and TE2. Referring to FIG. 5, the second auxiliary line 250-2 may be disposed so as to be opposite to the plurality of first touch electrodes TE1 with the touch insulating layer 156 therebetween. That is, the second auxiliary line 250-2 may extend in a direction parallel to an extending direction of the plurality of first touch electrodes TE1 or the plurality of second touch electrodes TE2. However, as described above, the second auxiliary line 250-2 has a mesh pattern, but may be disposed to be disconnected in an area adjacent to the bridge pattern 153 so as to be electrically isolated from the bridge pattern 153 of the active area AA.

Figure 6:
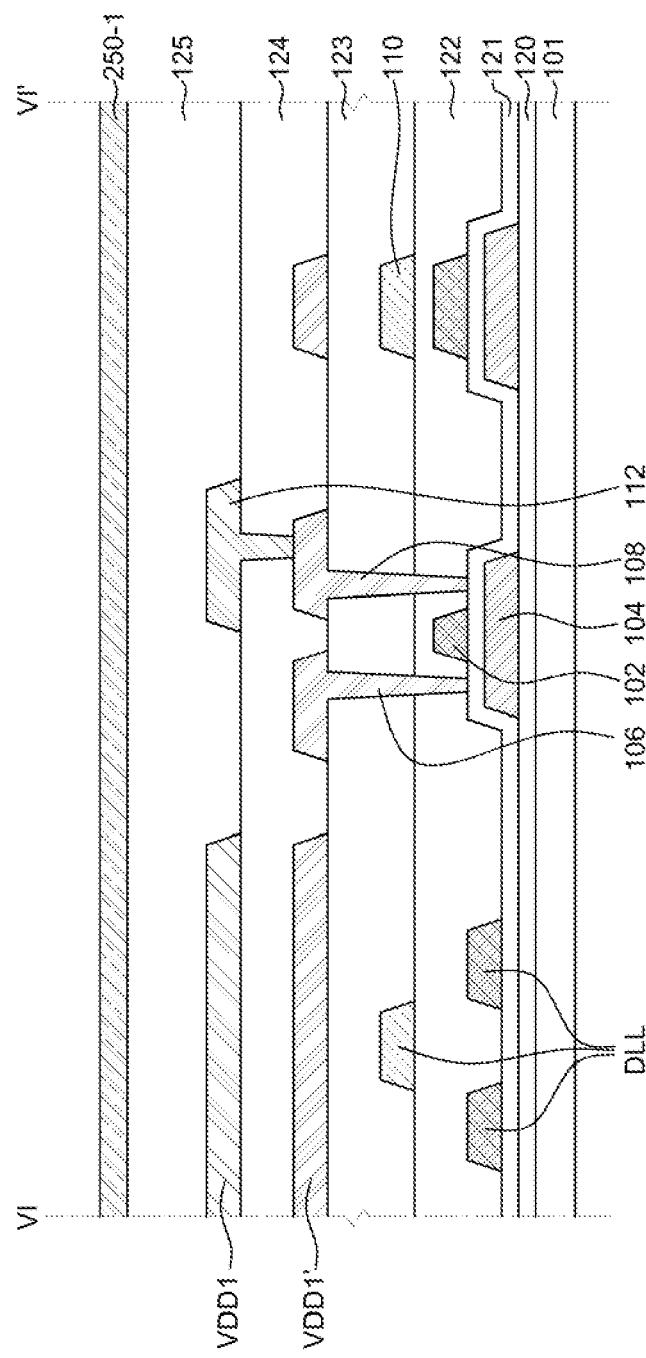
FIG. 6 is a cross-sectional view taken along line VI-VI' of FIG. 3B.
Figure 7:
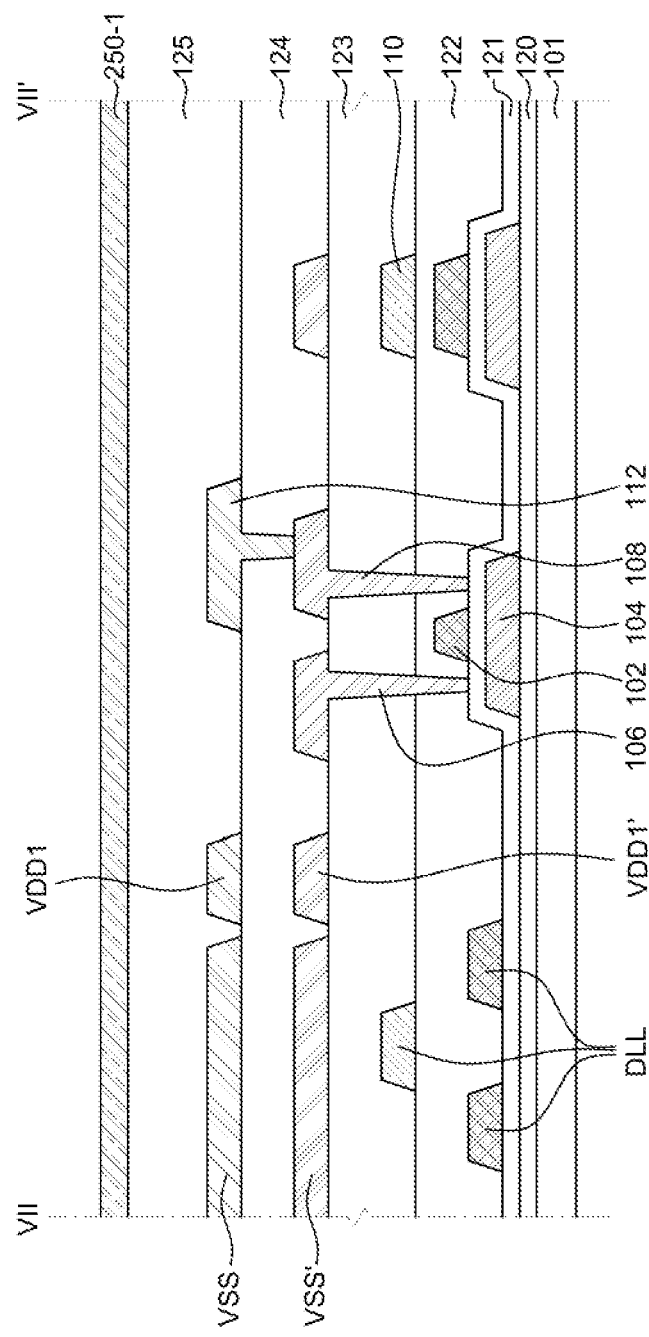
FIG. 7 is a cross-sectional view taken along line VII-VII' of FIG. 3B.

FIG. 6 is a cross-sectional view taken along line VI-VI' of FIG. 3B and FIG. 7 is a cross-sectional view taken along line VII-VII' of FIG. 3B. In FIGS. 6 and 7, for the convenience of description, among various components of the display device 100, only a substrate 101 to second planarization layer 125 and a first auxiliary line 250-1 are illustrated.

As described above, in the first inactive area IA1, the first high potential voltage line VDD1 and a part of the low potential voltage line VSS may be disposed. Referring to FIG. 6, a data link line DLL may be disposed below the first high potential voltage lines VDD1 and VDD1'. The data link line DLL is a wiring line which transmits a data signal from the data driver to the data line of the active area AA. The data link line DLL may be disposed between the gate insulating layer 121 and the first interlayer insulating layer 122 or between the first interlayer insulating layer 122 and the second interlayer insulating layer 123. That is, the data link line DLL may be formed of the same material on the same layer as the gate electrode 102 of the thin film transistor TFT or the conductive layer 110 of the active area AA.

The first high potential voltage lines VDD1 and VDD1' may be disposed between the second interlayer insulating layer 123 and the first planarization layer 124 or between the first planarization layer 124 and the second planarization layer 125. That is, the first high potential voltage lines VDD1 and VDD1' may be formed of the same material on the same layer as the source electrode 106 and the drain electrode 108 of the thin film transistor TFT of the active area AA or formed of the same material on the same layer as the connection electrode 112 of the active area AA. The high potential voltage line VDD is not limited to being disposed as a single layer, but may be formed as a multiple layer as illustrated in FIG. 6. In the case of the multiple layer, the first high potential voltage line VDD1' of any one layer may be formed of the same material on the same layer as the source electrode 106 and the drain electrode 108 of the active area AA. The first high potential voltage line VDD1 of the other layer may be formed of the same material on the same layer as the connection electrode 112 of the active area AA.

Referring to FIG. 7, the low potential voltage lines VSS and VSS' may be also formed of the same material on the same layer as the high potential voltage line VDD. That is, the low potential voltage line VSS may also be disposed between the second interlayer insulating layer 123 and the first planarization layer 124 or between the first planarization layer 124 and the second planarization layer 125. That is, the low potential voltage lines VSS and VSS' may be formed of the same material on the same layer as the source electrode 106 and the drain electrode 108 of the thin film transistor TFT of the active area AA or formed of the same material on the same layer as the connection electrode 112 of the active area AA. The low potential voltage lines VSS and VSS' are not limited to being disposed as a single layer, but may be formed as a multiple layer as illustrated in FIG. 7. In the case of the multiple layer, the low potential voltage line VSS' of any one layer may be formed of the same material on the same layer as the source electrode 106 and the drain electrode 108 of the active area AA. The low potential voltage line VSS of the other layer may be formed of the same material on the same layer as the connection electrode 112 of the active area AA.

Referring to FIGS. 6 and 7, the first auxiliary line 250-1 may be disposed on the second planarization layer 125 and may be disposed on the first high potential voltage lines VDD1 and VDD1' so as to overlap with the first high potential voltage lines VDD1 and VDD1' and the low potential voltage lines VSS and VSS'. Even though it is not illustrated in FIGS. 6 and 7, the first auxiliary line 250-1 may be electrically connected to the low potential voltage line VSS by means of a contact hole. However, the first auxiliary line 250-1 may be disposed to overlap with the first high potential voltage line VDD1 and the low potential voltage line VSS with the insulating layer, such as the second planarization layer 125, therebetween, in a portion excluding the contact hole.

Accordingly, in the display device 100 according to the exemplary aspect of the present disclosure, the influence of the electric field due to a potential difference between the high potential voltage and the low potential voltage may be minimized and the defect due to the excessive potential difference may be suppressed.

In the general display device, in order to cope with the demand for the improvement of the luminance, a high efficient element, such as a tandem element, is applied to the display device. The tandem element is an element with a structure in which emission structures are laminated in two or more stacks and each stack may include a hole transport layer, an organic emission layer, and an electron transport layer. The high efficient element such as a tandem element may show a high luminance even with a low current, but a high driving voltage is requested to drive the display device. However, when the high driving voltage is requested, a potential difference between the high potential voltage and the low potential voltage which are supplied to the pixel needs to be increased so that the influence of the electric field which may be generated in the substrate due to the potential difference is also increased. When the electric field generated due to the potential difference is applied to the thin film transistor, a threshold voltage of the corresponding thin film transistor may be shifted and the defect is generated in the display device to degrade the reliability.

Specifically, in a lower stage of the display device, an area in which the low potential voltage line and the high potential voltage line are disposed together forms a negative bias by the low potential voltage line so that negative electric charges are not confined in the substrate. However, in an area in which only the high potential voltage line is disposed, the high potential voltage line forms a positive bias so that the negative electric charges are confined in the substrate. Therefore, electric charges which are charged in the substrate form a back bias so that the thin film transistor disposed in an area adjacent to the high potential voltage line is applied with a bias stress and the threshold voltage of the thin film transistor is shifted to change a luminance characteristic so that the quality is degraded. That is, in the related art, the thin film transistor which is adjacent to the high potential voltage line is negatively shifted to degrade the kick-back capacity so that a defect that the luminance is abnormally bright in an area adjacent to the high potential voltage line is caused.

Therefore, in the display device 100 according to the exemplary aspect of the present disclosure, the first auxiliary line 250-1 which is electrically connected to the low potential voltage line VSS is disposed above the high potential voltage line VDD. The shift phenomenon of the thin film transistor in an area adjacent to the high potential voltage line VDD may be compensated. That is, the first auxiliary line 250-1 which is connected to the low potential voltage line VSS forms a negative bias, similar to the low potential voltage line VSS. Therefore, when the first auxiliary line is disposed above the high potential voltage line VDD, the influence of the electric field due to the positive bias of the high potential voltage line VDD may be reduced. That is, when the first auxiliary line 250-1 is disposed above the high potential voltage line VDD, the negative charges are not confined in the lower substrate of the high potential voltage line VDD. Accordingly, the threshold voltage shift phenomenon of the thin film transistor in an area adjacent to the high potential voltage line VDD may not be generated. That is, the lower local brightness defect due to the negative shift of the thin film transistor may be suppressed.

Further, in the display device 100 according to the exemplary aspect of the present disclosure, the second auxiliary line 250-2 connected to the first auxiliary line 250-1 is formed in the active area AA with a mesh pattern. Therefore, a potential difference between the high potential voltage and the low potential voltage is reduced to minimize the influence due to the electric field. That is, when the second auxiliary line 250-2 which is formed on the same layer as the bridge pattern 153 of the touch sensing unit is disposed on the entire surface of the active area AA with a mesh pattern while being electrically connected to the low potential voltage line VSS, the wiring lines which supply a low potential voltage are connected in parallel. Accordingly, the load may be reduced and the low potential voltage rising (VSS rising) which may be generated in the light emitting diode may be improved. When the low potential voltage rising (VSS rising) is suppressed, a low potential voltage setting margin may be ensured so that the low potential voltage may be increased. As the low potential voltage is increased, the potential difference between the high potential voltage and the low potential voltage is reduced so that the electric field by the potential difference is weakened. Accordingly, the defect generated due to the influence of the electric field caused by the excessive potential difference may be suppressed.

The exemplary aspects of the present disclosure can also be described as follows:

According to an aspect of the present disclosure, there is provided a display device. The display device includes a substrate including an active area and an inactive area which encloses the active area. The display device further includes a plurality of pixels which is disposed in the active area and includes a light emitting diode. The display device further includes a common voltage line which is disposed in the inactive area and is connected to the light emitting diode. The display device further includes an encapsulation unit which covers the active area and a part of the inactive area. The display device further includes a touch sensing unit disposed on the encapsulation unit. The display device further includes an auxiliary line which is disposed on the encapsulation unit and is connected to the common voltage line. The touch sensing unit includes: a plurality of touch electrodes which includes a plurality of first touch electrodes and a plurality of second touch electrodes; and a bridge pattern which connects the plurality of second touch electrodes. The auxiliary line is formed of the same material as the bridge pattern and is disposed on the same layer as the bridge pattern and the auxiliary line is disposed in both the active area and the inactive area.

The auxiliary line may include: a first auxiliary line which is disposed in the inactive area to be connected to the common voltage line; and a second auxiliary line which is connected to the first auxiliary line and is disposed in the active area.

The first auxiliary line may be disposed in the inactive area so as to enclose the active area.

The first auxiliary line may have a closed loop shape.

The display device may further include a dam which is disposed in the inactive area and suppresses the overflowing of an organic encapsulation layer of the encapsulation unit. The first auxiliary line may be connected to the common voltage line to be closer to the outside of the substrate than the dam.

The second auxiliary line may be disposed with a mesh pattern in the active area.

The second auxiliary line may be disposed in the active area excluding an area in which the bridge pattern is disposed.

The mesh pattern of the second auxiliary line may overlap with a mesh pattern of the plurality of touch electrodes.

The second auxiliary line may be electrically isolated from the bridge pattern.

The display device may further include a high potential voltage line which is disposed in the inactive area so as to enclose one side of the active area. The first auxiliary line may be disposed on the high potential voltage line so as to overlap with the high potential voltage line.

The high potential voltage line may be disposed to be more adjacent to one side of the active area than the common voltage line.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a substrate including an active area and an inactive area which encloses the active area;
   a plurality of pixels disposed in the active area and including a light emitting diode;
   a common voltage line disposed in the inactive area and connected to the light emitting diode;
   an encapsulation unit covering the active area and a part of the inactive area;
   a touch sensing unit disposed on the encapsulation unit; and
   an auxiliary line disposed on the encapsulation unit and connected to the common voltage line,
   wherein the touch sensing unit includes:
   a plurality of touch electrodes including a plurality of first touch electrodes and a plurality of second touch electrodes; and
   a bridge pattern connecting the plurality of first touch electrodes, and
   wherein the auxiliary line is formed of a same material as the bridge pattern and is disposed on a same layer as the bridge pattern,
   wherein the auxiliary line is disposed in both the active area and the inactive area,
   wherein the auxiliary line includes:
   a first auxiliary line disposed in the inactive area and connected to the common voltage line; and
   a second auxiliary line disposed in the active area and connected to the first auxiliary line, wherein the second auxiliary line is electrically isolated from the bridge pattern.

2. The display device according to claim 1, further comprising a dam disposed in the inactive area and suppressing overflow of an organic encapsulation layer of the encapsulation unit, wherein the first auxiliary line is connected to the common voltage line and disposed to be closer to outside the substrate than the dam.

3. The display device according to claim 1, further comprising a touch insulating layer disposed on the bridge pattern, wherein the plurality of first touch electrodes and the plurality of second touch electrodes are disposed on the touch insulating layer, and wherein the second auxiliary line is disposed to be opposite to the plurality of first touch electrodes with the touch insulating layer therebetween.

4. The display device according to claim 1, wherein the first auxiliary line is disposed in the inactive area to enclose the active area.

5. The display device according to claim 3, wherein the first auxiliary line has a closed loop shape.

6. The display device according to claim 1, wherein the second auxiliary line is disposed with a mesh pattern in the active area.

7. The display device according to claim 6, wherein the second auxiliary line is disposed in the active area excluding an area in which the bridge pattern is disposed.

8. The display device according to claim 6, wherein the mesh pattern of the second auxiliary line overlaps with a mesh pattern of the plurality of touch electrodes.

9. The display device according to claim 1, further comprising a high potential voltage line disposed in the inactive area enclosing one side of the active area, wherein the first auxiliary line is disposed on the high potential voltage line and overlapping with the high potential voltage line.

10. The display device according to claim 9, wherein the high potential voltage line is disposed to be more adjacent to one side of the active area than the common voltage line.

11. The display device according to claim 9, wherein the inactive area includes:
   a first inactive area provided at a first edge of the substrate;
   a second inactive area provided at a second edge of the substrate parallel to the first inactive area;
   a third inactive area provided at a third edge of the substrate; and
   a fourth inactive area provided at a fourth edge of the substrate parallel to the third inactive area,
   wherein the common voltage line is disposed along the second to fourth inactive areas with a constant line width and encloses a remaining portion excluding a part of the active area adjacent to the first inactive area.

12. The display device according to claim 11, wherein the high potential voltage line is disposed in the first inactive area to enclose one side of the active area.

13. The display device according to claim 9, wherein the high potential voltage line includes:
   a first high potential voltage line adjacent to the active area;
   a second high potential voltage line adjacent to a pad portion of the display device; and
   a third high potential voltage line connecting the first high potential voltage line and the second high potential voltage line,
   wherein, in a corner area of the first inactive area in which both the first high potential voltage line and the common voltage line are disposed, the first high potential voltage line is disposed to be closer to the inside than the common voltage line.

14. The display device according to claim 13, wherein the first auxiliary line is opposite to the first high potential voltage line with an insulating layer therebetween.

15. The display device according to claim 9, wherein the common voltage line is formed of a same material on a same layer as the high potential voltage line.

* * * * *